(12) United States Patent
Mebarki et al.

(10) Patent No.: US 10,927,451 B2
(45) Date of Patent: Feb. 23, 2021

(54) METHODS AND APPARATUS FOR PATTERNING SUBSTRATES USING ASYMMETRIC PHYSICAL VAPOR DEPOSITION

(71) Applicant: APPLIED MATERIALS, INC., Santa Clara, CA (US)

(72) Inventors: Bencherki Mebarki, Santa Clara, CA (US); Byeong Chan Lee, Pleasanton, CA (US); Huixiong Dai, San Jose, CA (US); Tejinder Singh, San Jose, CA (US); Joung Joo Lee, San Jose, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/541,688

(22) Filed: Aug. 15, 2019

(65) Prior Publication Data
US 2020/0255937 A1   Aug. 13, 2020

Related U.S. Application Data

(60) Provisional application No. 62/803,148, filed on Feb. 8, 2019.

(51) Int. Cl.
| | |
|---|---|
| *C23C 14/54* | (2006.01) |
| *C23C 14/58* | (2006.01) |
| *C23C 14/34* | (2006.01) |
| *H01L 21/02* | (2006.01) |

(52) U.S. Cl.
CPC .............. *C23C 14/54* (2013.01); *C23C 14/34* (2013.01); *C23C 14/5873* (2013.01); *H01L 21/02631* (2013.01)

(58) Field of Classification Search
None
See application file for complete search history.

(56) References Cited

U.S. PATENT DOCUMENTS

| | | | |
|---|---|---|---|
| 5,529,952 A | * | 6/1996 | Smith .................... B82Y 10/00 117/88 |
| 6,063,707 A | | 5/2000 | Atwater |
| 6,066,358 A | | 5/2000 | Guo et al. |
| 7,446,058 B2 | | 11/2008 | Yang et al. |
| 2006/0189133 A1 | | 8/2006 | Dimitrakopoulos et al. |

(Continued)

*Primary Examiner* — Allan W. Olsen
(74) *Attorney, Agent, or Firm* — Moser Taboada

(57) ABSTRACT

Methods and apparatus for processing a substrate. The method, for example, includes directing a stream of material from a PVD source at a first non-perpendicular angle to selectively deposit the material on a top portion of one or more features on the substrate and form a first overhang and a second overhang extending beyond a third sidewall and a fourth sidewall that are arranged parallel and opposite to each other and at non-zero angles to a first sidewall and a second sidewall, the first sidewall and the second sidewall defining a length of the one or more features, and the third sidewall and fourth sidewall defining a width of the one or more features; performing an etch process to selectively remove some of the first sidewall and the second sidewall while keeping the third sidewall and fourth sidewall in intact and maintaining the width of the one or more features.

20 Claims, 5 Drawing Sheets

(56) References Cited

U.S. PATENT DOCUMENTS

| | | | |
|---|---|---|---|
| 2007/0166981 A1* | 7/2007 | Furukawa | H01L 21/76885 438/597 |
| 2008/0042283 A1 | 2/2008 | Purushothaman et al. | |
| 2019/0276926 A1* | 9/2019 | Lee | C23C 14/505 |
| 2020/0135464 A1* | 4/2020 | Kesapragada | C23C 14/225 |
| 2020/0199741 A1* | 6/2020 | Mebarki | H01L 21/0337 |
| 2020/0255937 A1* | 8/2020 | Mebarki | C23C 14/34 |

* cited by examiner

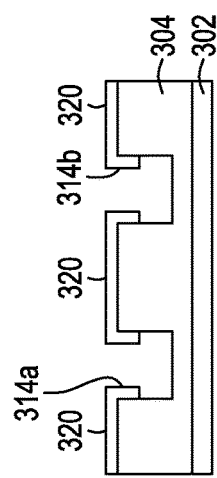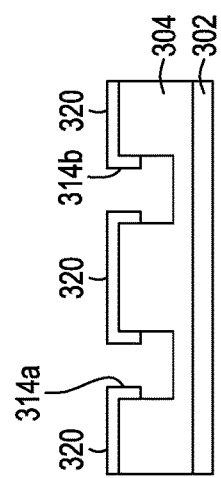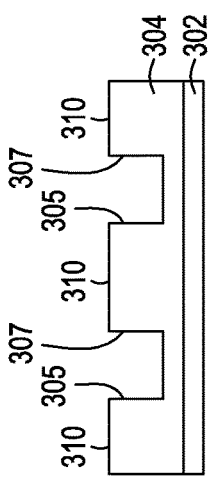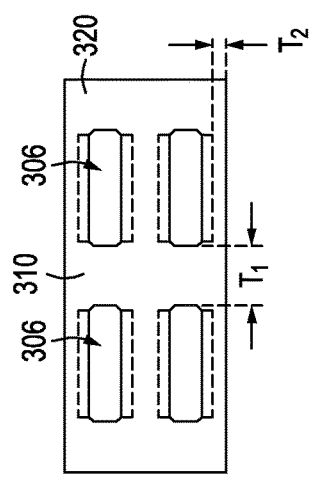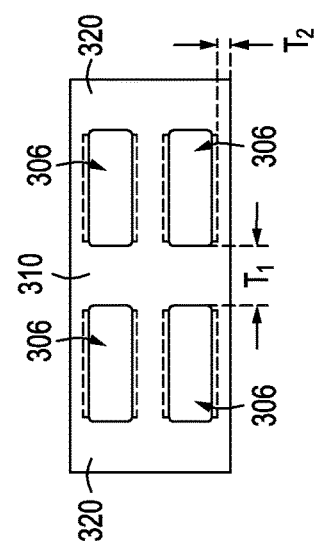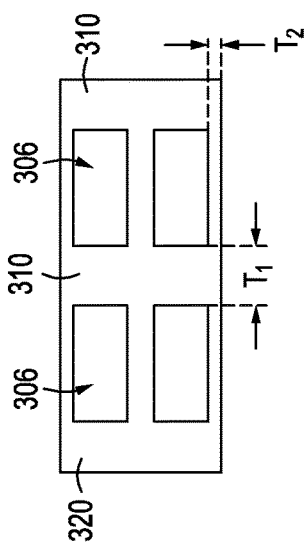
FIG. 3D
FIG. 3E
FIG. 3F

METHODS AND APPARATUS FOR PATTERNING SUBSTRATES USING ASYMMETRIC PHYSICAL VAPOR DEPOSITION

CROSS-REFERENCE TO RELATED APPLICATIONS

This application claims the benefit of and priority to U.S. Provisional Patent Application Ser. No. 62/803,148, which was filed on Feb. 8, 2019, the entire contents of which is incorporated herein by reference.

FIELD

Embodiments of the present disclosure generally relate to substrate processing equipment and techniques, and more particularly, to methods and apparatus for performing physical vapor deposition (PVD).

BACKGROUND

The semiconductor processing industry generally continues to strive for increased uniformity of layers deposited on substrates. For example, with shrinking circuit sizes leading to higher integration of circuits per unit area of the substrate, increased uniformity is generally seen as desired, or required in some applications, to maintain satisfactory yields and reduce the cost of fabrication. Various technologies have been developed to deposit layers on substrates in a cost-effective and uniform manner, such as chemical vapor deposition (CVD) or physical vapor deposition (PVD).

However, the inventors have observed that with the drive to produce equipment to deposit more uniformly, certain applications may not be adequately served where purposeful deposition is required that is not symmetric or uniform with respect to the given structures being fabricated on a substrate. For example, the inventors have observed that asymmetric or non-uniform deposition of target material during a PVD process can advantageously be used to provide increased tip-to-tip reduction (e.g., a decrease in distance along a first axis between two features deposited on an underlying substrate) along a first axis of a feature deposited on an underlying substrate while maintaining a critical dimension along a second axis of the feature.

SUMMARY

Methods and apparatus for processing a substrate are provided herein. In some embodiments, for example, a method for processing a substrate includes directing a stream of material from a PVD source toward a surface of a substrate at a first non-perpendicular angle to a plane of the surface to selectively deposit the material on the top portion of the one or more features on the substrate and form a first overhang and a second overhang extending beyond a third sidewall and a fourth sidewall that are arranged parallel and opposite to each other and at non-zero angles to a first sidewall and a second sidewall, the first sidewall and the second sidewall defining a length along a y-axis defined through the one or more features, and the third sidewall and fourth sidewall defining a width along an x-axis defined through the one or more features; and performing an etch process to selectively remove some of the first sidewall, the second sidewall, the first overhang, and the second overhang to increase the length of the one or more features by a predetermined distance while keeping the third sidewall and fourth sidewall in intact and maintaining the width of the one or more features.

In accordance with at least some embodiments of the present disclosure, a method for processing a substrate includes directing a stream of material from a PVD source toward a surface of a substrate at a first non-perpendicular angle to a plane of the surface to selectively deposit a material on a top portion of one or more features on the substrate and form a first overhang and a second overhang extending beyond a third sidewall and a fourth sidewall that are arranged parallel and opposite to each other and at non-zero angles to a first sidewall and a second sidewall, the first sidewall and the second sidewall defining a length along a y-axis defined through the one or more features, and the third sidewall and fourth sidewall defining a width along an x-axis defined through the one or more features; and performing an etch process to sequentially remove some of the deposited material on the top portion of the one more or more features adjacent the first sidewall and the second sidewall to increase the length of the one or more features by a predetermined distance while keeping the third sidewall and fourth sidewall in intact and maintaining the width of the one or more features.

In accordance with at least some embodiments of the present disclosure, there is provided a nontransitory computer readable storage medium having stored thereon a plurality of instructions that when executed cause a process controller to perform a method for processing a substrate. The method includes directing a stream of material from a PVD source toward a surface of a substrate at a first non-perpendicular angle to a plane of the surface to selectively deposit the material on the top portion of the one or more features on the substrate and form a first overhang and a second overhang extending beyond a third sidewall and a fourth sidewall that are arranged parallel and opposite to each other and at non-zero angles to a first sidewall and a second sidewall, the first sidewall and the second sidewall defining a length along a y-axis defined through the one or more features, and the third sidewall and fourth sidewall defining a width along an x-axis defined through the one or more features; and performing an etch process to selectively remove some of the first sidewall, the second sidewall, the first overhang, and the second overhang to increase the length of the one or more features by a predetermined distance while keeping the third sidewall and fourth sidewall in intact and maintaining the width of the one or more features.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 3A-3F illustrate schematic diagrams of stages of fabrication of a substrate undergoing methods in accordance with at least some embodiments of the disclosure.

Figure 1:
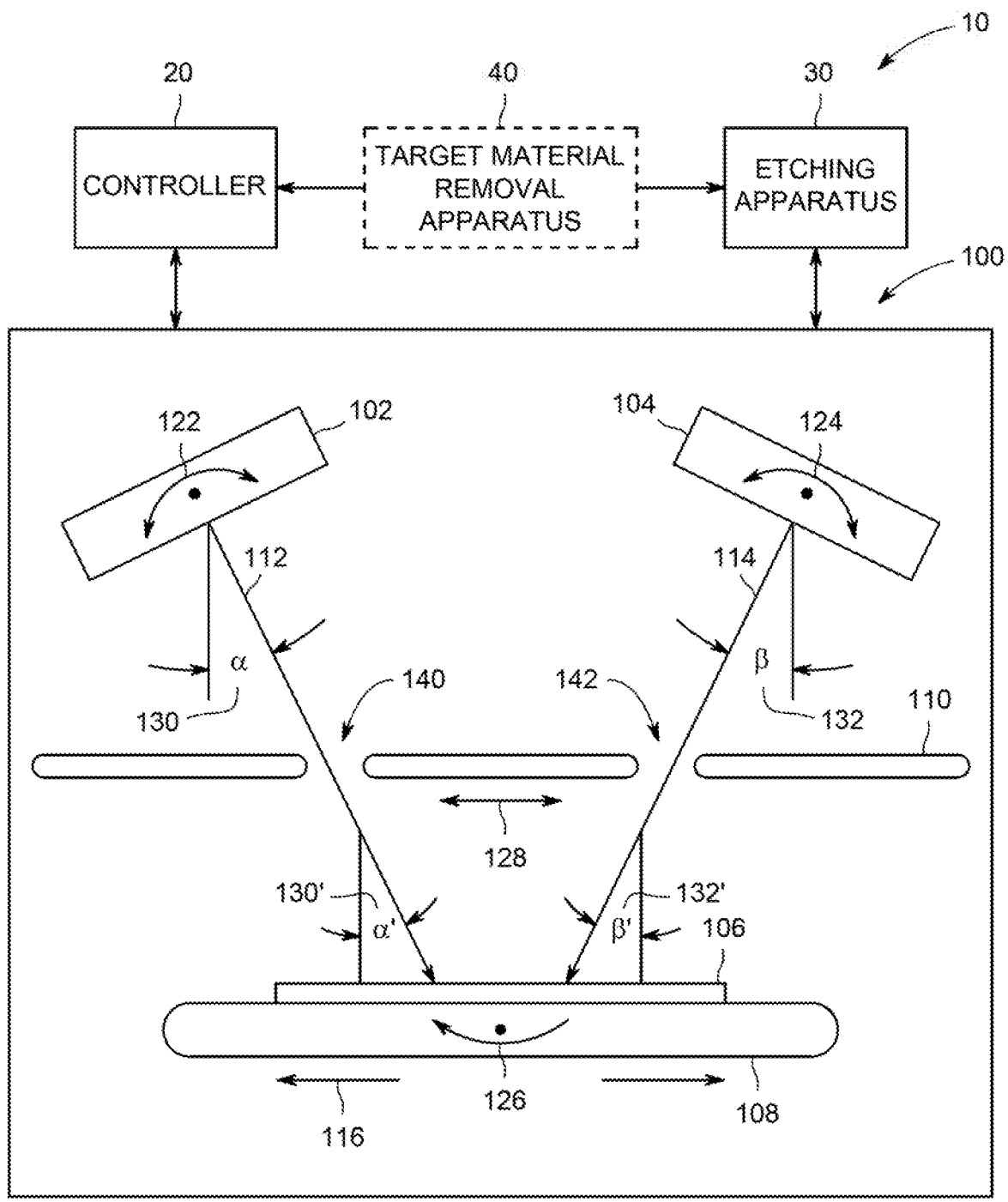
FIG. 1 is a schematic diagram of a system that includes an apparatus used for PVD of material on substrates and an etching apparatus in accordance with at least some embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for performing PVD are disclosed herein. Embodiments of the disclosed methods and apparatus advantageously enable uniform angular deposition of materials on a substrate. In such applications, deposited materials are asymmetric or angular with respect to a given feature on a substrate, but can be relatively uniform within all features across the substrate. Furthermore, embodiments of the disclosed methods and apparatus advantageously can be used to provide increased tip-to-tip reduction (e.g., a decrease in distance along a first axis between two features deposited on an underlying substrate) while maintaining a critical dimension along a second axis of the feature.

FIG. 1 is a schematic side view of a system 10 that includes a PVD apparatus 100, which can be controlled by a process controller 20 (or processor), and an etching apparatus 30, in accordance with at least some embodiments of the disclosure. In some embodiments, each of the PVD apparatus 100 and the etching apparatus 30 can be controlled by the process controller 20. In some embodiments, the etching apparatus 30 can be controlled by a separate controller.

The PVD apparatus 100 is configured for the deposition of materials on a substrate 106 at a non-perpendicular angle to the generally planar surface of the substrate. The PVD apparatus 100 generally includes a first PVD source 102 and a substrate support 108 for supporting a substrate 106. The PVD apparatus 100 can also include one or more collimators 110.

The first PVD source 102 is configured to provide a first directed stream of material flux (e.g., a first stream 112) from the source toward the substrate support 108 (and any substrate 106 disposed on the substrate support 108). In some embodiments, the PVD apparatus 100 may include a second PVD source 104 configured to provide a second directed stream of material flux (e.g., a second stream 114) from the source toward the substrate support 108 (and any substrate 106 disposed on the substrate support 108). The substrate support has a support surface to support the substrate such that a working surface of the substrate to be deposited on is exposed to the first stream 112 of material flux and, when present, the second stream 114 of material flux. The first and second streams 112, 114 of material flux provided by the first and second PVD sources 102, 104 have a width greater than that of the substrate support 108 (and any substrate 106 disposed on the substrate support 108). The first and second streams 112, 114 of material flux have a linear elongate axis corresponding to the width of the first and second streams 112, 114 of material flux. The substrate support 108 is configured to move linearly with respect to the first and second PVD sources 102, 104, as indicated by arrows 116. Optionally, the substrate support 108 may additionally be configured to rotate about a z-axis of the substrate support 108 (e.g., a central axis perpendicular to the support surface) or tilt about a y-axis of the substrate support 108, as indicated by arrow 126. Deposition of materials at a non-perpendicular angle to the substrate surface can be used to advantageously create an overhang that extends beyond one or more sidewalls of a feature that is disposed on the substrate 106, as will be described in greater detail below.

The first and second PVD sources 102, 104 include target material to be sputter deposited on the substrate. In some embodiments, the target material of the first and second PVD sources 102, 104 are the same target material. Alternatively, in some embodiments, the respective target materials of the first and second PVD sources 102, 104 are different from each other. The target material can be, for example, a metal, such as titanium, or the like, suitable for depositing titanium (Ti) or titanium nitride (TiN) on the substrate. In some embodiments, the target material can be, for example, silicon, or a silicon-containing compound, suitable for depositing silicon (Si), silicon nitride (SiN), silicon oxynitride (SiON), or the like on the substrate. Other suitable materials may be used as well in accordance with the teachings provided herein. The first PVD source 102 further includes, or is coupled to, a power source to provide suitable power for forming a plasma proximate the target material and for sputtering atoms off the target material. The power source can be either or a combination of a DC, Pulsed DC, HiPIM, or an RF power source.

Unlike an ion beam or other ion source, the first and second PVD sources 102, 104 are configured to provide mostly neutrals and few ions of the target material. As such, a plasma may be formed having a sufficiently low density to avoid ionizing too many of the sputtered atoms of target material. For example, for a 300 mm diameter wafer as the substrate, about 1 to about 20 kW of DC or RF power may be provided. The power or power density applied can be scaled for other size substrates. In addition, other parameters may be controlled to assist in providing mostly neutrals in the first and second streams 112, 114 of material flux. For example, the pressure may be controlled to be sufficiently low so that the mean free path is longer than the general dimensions of an opening of the first and second PVD sources 102, 104 through which the stream of material flux passes toward the substrate support 108 (as discussed in more detail below). In some embodiments, the pressure may be controlled to be about 0.1 to about 5 millitorr.

The lateral angles of incidence of the first and second streams of material flux can be controlled. For example, FIG. 1 depicts the PVD apparatus 100 illustrating material deposition angle α 130 of the first stream 112 from the first PVD source 102 and angle β 132 of the second stream 114 from the second PVD source 104 in accordance with the present disclosure. The angles α 130 and β 132 can either be fixed or adjustable by rotating the first PVD source 102 as shown by arrow 122, and/or rotating the second PVD source 104 as shown by arrow 124. In some embodiments, the angles α 130 and β 132 can be measured as an average angle of incidence with respect to the plane of the substrate 106 (e.g., a simple average of maximum and minimum angles of incidence for particles in a given stream of material flux). In some embodiments, the angles α 130 and β 132 can be measured as a primary angle of incidence with respect to the plane of the substrate 106 (e.g., a volume or mass weighted average of various angles of incidence for particles in a given stream of material flux).

In addition to the angles α 130 and β 132, within-plane angles at which the first stream 112 and the second stream 114 are directed toward the substrate 106 surface can also be used to create the overhang on the feature that is disposed on a substrate, as discussed in more detail below.

As discussed above, the apparatus can optionally include the collimator 110. The collimator 110 is a physical structure such as a shroud, disk, a plurality of baffles, or the like, having one or more openings 140, 142. When present, the collimator 110 is interposed between the first and second PVD sources 102, 104 and the substrate 106 such that the first and second streams 112, 114 of material flux travel through the collimator 110 to reach the substrate 106. Any materials with an angle to great to pass through the openings 140, 142 of the collimator 110 will be blocked, thus limiting the permitted angular range of materials reaching the surface of substrate 106. The collimator 110 may include a single opening. Alternatively/additionally the PVD apparatus 100 may include a single collimator 110 having multiple openings. The collimator can function as a spread angle control apparatus that controls the angle of the spread of materials being sputtered from the first and/or second PVD sources. The one or more collimators 110 can move linearly as shown by arrow 128.

The angle of incidence 130', 132' at which the first and second streams 112, 114 of material actually contact the substrate surface may be different than the angle of incidence 130, 132 at which the streams of material are provide by the first PVD source 102 and the second PVD source 104. The angle of incidence 130', 132' at which the first and second streams 112, 114 of material actually contact the substrate surface can be controlled/altered by one or more of the following: the angle of incidence 130, 132 at which the streams of material are provided by the first PVD source 102 and the second PVD source 104, the number and placement of openings in collimator 110, the linear position of collimator 110, and the rotation (e.g. arrow 126) of the substrate support 108 about the x-axis, y-axis, and/or z-axis.

The process controller 20 controls the overall operation of the PVD chamber 11. More particularly, the process controller 20 controls at least one or more of the first PVD source 102, the second PVD source 104 (when present), the substrate support 108, or the collimator 110 (when present). The process controller 20 can control movement of the substrate support 108, movement of the first PVD source 102 and movement of the second PVD source 104 for directing the first and second streams 112, 114 of material flux toward the substrate at one or more of the above-reference angles, and movement of the collimator 110, if used. The process controller 20 can also control a pressure inside the PVD apparatus 100 and an amount of power provided to a target material prior to, during and/or after PVD of the material onto the substrate 106.

The etching apparatus 30 can be configured to perform one or more suitable etching processes. For example, the etching apparatus 30 can be configured to perform a dry etching process and/or a wet etching process. The etching apparatus 30, for example, can be configured to perform a dry plasma etching process suitable for selectively etching materials as described in more detail below. Additionally, the etching apparatus 30 can be configured to perform an isotropic and/or an anisotropic etch process.

After an etching process of the substrate 106 is completed, removal of the deposited material may be necessary. Accordingly, one or more suitable target material removal apparatus 40 may be used to remove (e.g., strip away) the deposited material from the substrate 106. For example, the target material removal apparatus 40 can be a plasma etch chamber, which can be a component of the etching apparatus 30, but configured to etch material deposited on the substrate 106 using one or more gases that can be different from the gases used by the etching apparatus 30, or a separate stand-alone apparatus that can, for example, use dry $O_2$ ashing or other suitable techniques to remove/strip the deposited material from the substrate 106. The target material removal apparatus 40 can also be used to perform a de-scum etching procedure, as described in greater detail below.

The methods and embodiments disclosed herein advantageously enable deposition of materials with a shaped profile (e.g., creating an overhang) that may advantageously be used as an etch mask layer to control (e.g., increase) tip-to-tip reduction along a first axis of one or more features while maintaining a critical dimension along a second axis of the one or more features.

Figure 2:
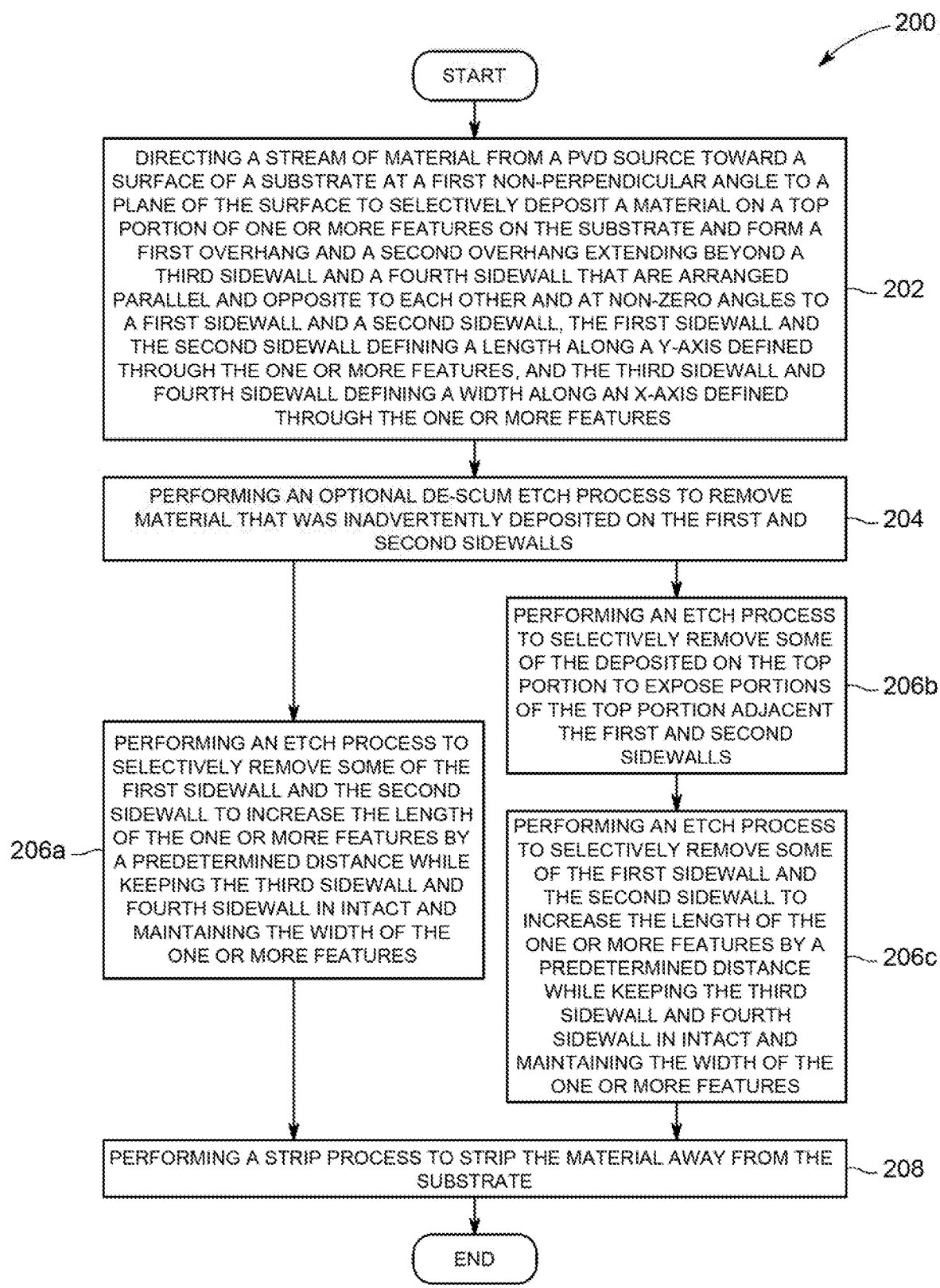
FIG. 2 is a flowchart of a method for processing a substrate in accordance with at least some embodiments of the disclosure.

For example, FIG. 2 depicts a flowchart of a method for processing a substrate in accordance with at least some embodiments of the disclosure. The method of FIG. 2 can be used, for example, to provide increased tip-to-tip reduction along a first axis of a feature deposited on an underlying substrate while maintaining a critical dimension along a second axis of the feature. FIGS. 3A-3F illustrate schematic diagrams of the stages of fabrication of a substrate 300 in accordance with at least some embodiments of the disclosure.

Figure 3A:
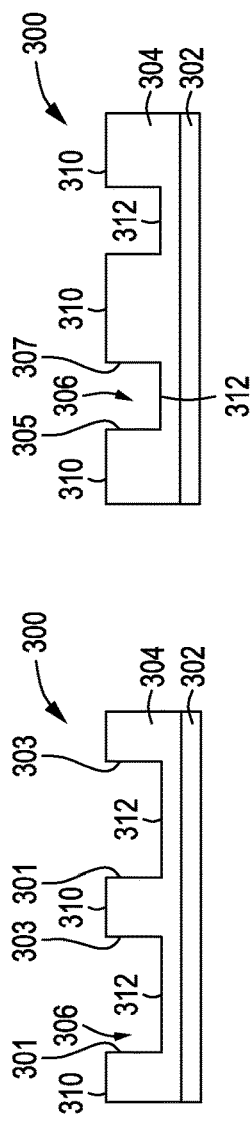
Figure 3A:
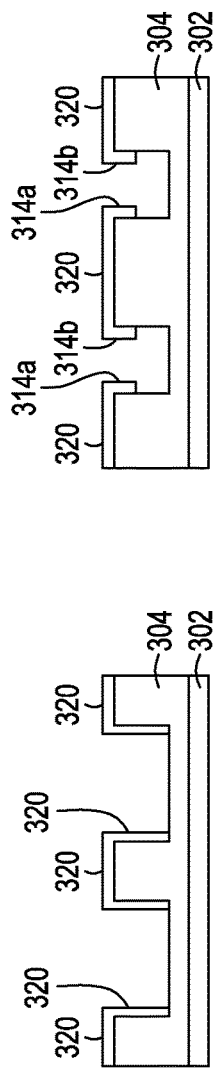
Figure 3A:
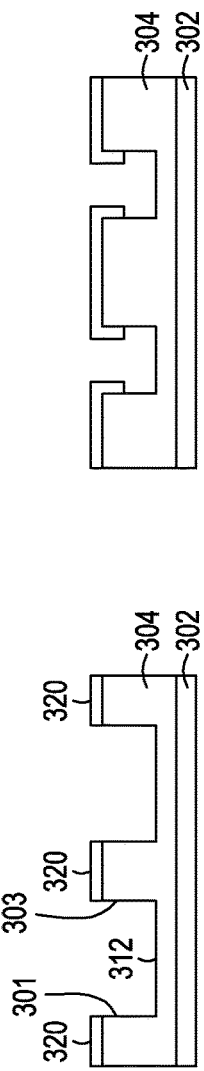
Figure 3A:
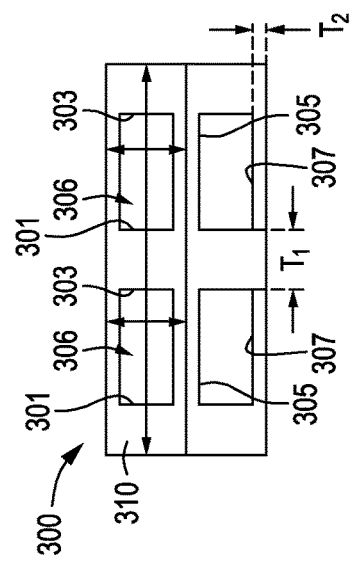

FIG. 3A illustrates the substrate 300 which includes a first layer (a layer 302), e.g., an etch stop layer (ESL) or a sacrificial layer, and a second layer 304 (layer 304) including at least one feature 306, which can be disposed over or on the layer 302. Alternatively or additionally, the layer 304 can be disposed over or on one or more other layers (e.g., photoresist layer, adhesion layer, transfer layer, planarization layer, hard mask layer, etc.) that can be disposed over or on the layer 302. For illustrative purposes, the layer 304 is shown including two features 306. Examples of material that can be used for the layer 302 can include, but are not limited to, aluminum nitride (AlN), aluminum oxynitride (AlON), titanium nitride (TiN), silicon oxycarbide (SiOC), silicon oxynitride (SiON), etc. Examples of material that can used for the layer 304 can include, but are not limited to, silicon nitride (SiN), titanium nitride (TiN), silicon oxide ($SiO_x$), aluminum nitride (AlN), aluminum oxynitride (AlON), aluminum carbonitride (AlCN), hafnium dioxide (HfO2), spin-on carbon (SOC), advanced patterning film (APF), amorphous carbon (α-C), photo resistive film (PR), silicon (Si), etc. The features 306 can be a fin, an opening, a trench, a via, or a dual damascene feature, or the like, and can protrude from the substrate 300 rather than extend into the layer 304 of the substrate 300. While the foregoing is directed to embodiments of the present disclosure, other and further embodiments of the disclosure may be devised without departing from the basic scope thereof. In some embodiments, the layer 304 can be deposited over or on the layer 302 and the features 306 can be formed using one or more suitable hard mask layers and one or more of the above described etching processes.

The layer 304 includes a top portion 310, on which a material 320 (FIG. 3B) is deposited, and a bottom portion 312 that extends from the layer 304. Examples of the material 320 can be titanium (Ti), titanium nitride (TiN), silicon (Si), silicon nitride (SiN), carbon (C), and silicon oxynitride (SiON). The features 306 (e.g., openings, vias, trenches, or the like) extend partially through the layer 304 to the bottom portion 312 and are defined by a first sidewall 301, a second sidewall 303, a third sidewall 305, and a fourth sidewall 307. In some embodiments, the first sidewall 301 and the second sidewall 303 are parallel and opposite to each other and arranged at non-zero angles to the third sidewall 305 and the fourth sidewall 307. In some embodiments, the first sidewall 301 and the second sidewall 303 are parallel and opposite to each other and arranged at a 90 degree angle to the third sidewall 305 and the fourth sidewall 307.

As depicted in FIG. 3A, the first sidewall 301 and the second sidewall 303 define a length of the features 306 along an y-axis (e.g., a first axis in a plane parallel to the primary surface of the substrate), and the third sidewall 305 and the fourth sidewall 307 define a width of the features 306 along a x-axis (e.g., a second axis in the plane parallel to the primary surface of the substrate, perpendicular to the first axis). In accordance with at least some embodiments, tip-to-tip reduction between two adjacent features 306 can be increased along the y-axis, while the dimension (e.g., the critical dimension) along the x-axis can be maintained.

Figure 3B:
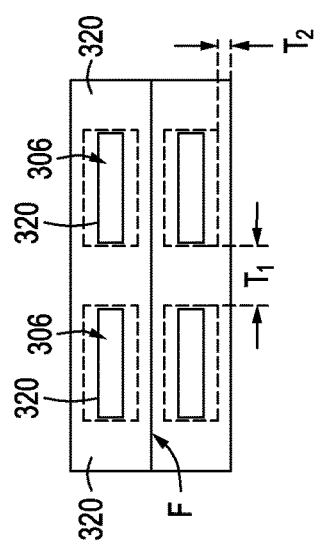

The method 200 for processing the substrate 300 begins at 202, where a stream of the material 320 from the first PVD source 102 is directed toward the substrate 300 surface at a non-perpendicular angle, e.g., α 130, α 132, or other suitable angle to the plane of the substrate 300 surface (see directional arrow F of FIG. 3B, for example). Alternatively or additionally, the second PVD source 104 or both the first and second PVD sources 102, 104, respectively can be used to deposit the material 320. In embodiments where both the first PVD source 102 and the second PVD source 104 are used, the PVD sources can be used simultaneously or sequentially.

The material 320 is deposited on the top portion 310 of the layer 304 to form overhangs 314a, 314b that extend beyond, for example, the third sidewall 305 and the fourth sidewall 307 of the features 306. More particularly, the stream of material 320 is directed from the first PVD source 102, and the angle at which the stream of material 320 is directed allows for asymmetric deposition of the material 320 around the features 306. That is, the overhangs 314a, 314b extend beyond the third sidewall 305 and the fourth sidewall 307, and do not substantially extend beyond the first sidewall 301 and the second sidewall 303 (FIG. 3B) because of the angle of the stream of the material 320. Alternatively or in combination, in some embodiments, overhang may be formed on the third sidewall 305 and the fourth sidewall 307 by control of the relative orientation of the substrate with respect to the stream of material 320, as described in greater detail below.

The collimator 110, which includes an opening, can be used to limit the angular range of the stream of material 320. More particularly, the placement of the collimator 110 (and physical structure of the collimator 110) with respect to the first PVD source 102 can be used to control the angle of incidence 130' that the stream of the material 320 contacts the surface of the substrate 300, and, therefore can be used to control how far the overhangs 314a, 314b extend beyond the third sidewall 305 and the fourth sidewall 307 and the amount of (or thickness of) the material 320 that is deposited adjacent to the third sidewall 305 and the fourth sidewall 307; however, as noted above, use of the collimator 110 is optional.

The substrate 300 can be scanned (e.g., linearly along arrow 116) through the stream of material 320 via the substrate support 108 to ensure that the material 320 forms the overhangs 314a, 314b that extend beyond only the third sidewall 305 and the fourth sidewall 307, with minimal or no coverage on the first sidewall 301 and the second sidewall 303 (compare middle diagram of FIG. 3B with right diagram of FIG. 3B, for example).

The distance that the overhangs 314a, 314b extend beyond the third sidewall 305 and the fourth sidewall 307 can depend on, but is not limited to, the material used for the PVD process, the angle at which the stream of material 320 is provided at, the angle of incidence 130' that is controlled by the collimator 110, how many times the substrate support 108 is scanned, an angle at which the substrate support 108 is rotated, whether or not the second PVD source 104 is used in conjunction with the first PVD source 102, etc. Likewise, the amount or thickness of the material 320 on the top portion 310 adjacent the third sidewall 305 and the fourth sidewall 307 can be greater than the amount or thickness of the of the material 320 on the top portion 310 adjacent the first sidewall 301 and the second sidewall 303, which protects (e.g., masks) the third sidewall 305 and the fourth sidewall 307 during the below described etching processes.

Figure 3C:
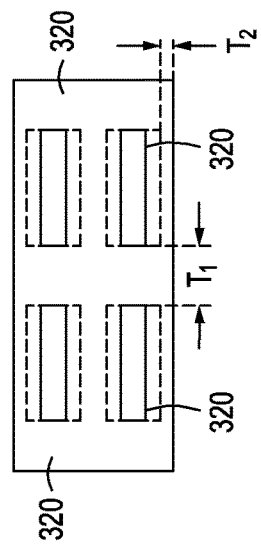

At 204, an optional de-scum etch process can be performed, for example, to remove material 320 that was inadvertently deposited on the first sidewall 301 and the second sidewall 303. During the etching process of 204 some of the material 320 that forms the overhangs 314a, 314b and some of the material 320 on the top portion 310 adjacent the first sidewall 301, the second sidewall 303, the third sidewall 305, and the fourth sidewall 307 may also be removed. After 204, most of the material 320 will remain on the top portion 310 of the features 306, as will the overhangs 314a, 314b that extend beyond the third sidewall 305 and the fourth sidewall 307 (FIG. 3C). More particularly, the amount of the material 320 remaining on the top portion 310 of the features 306 adjacent the first sidewall 301 and the second sidewall 303 will be less than the amount of material 320 that remains on the top portion 310 adjacent the third sidewall 305 and the fourth sidewall 307 that forms the overhangs 314a, 314b.

Next, at 206a the substrate 300 can selectively etched. More particularly, the substrate 300 is selectively etched to remove some of the material 320 on the top portion 310 adjacent the first sidewall 301 and the second sidewall 303 and some of the first sidewall 301 and the second sidewall 303 (see FIGS. 3D and 3E, for example). Moreover, some of the material 320 on the top portion 310 adjacent the third sidewall 305 and the fourth sidewall 307 that forms the overhangs 314a, 314b will also be removed, but since the third sidewall 305 and the fourth sidewall 307 are covered by the material 320 that forms the overhangs 314a, 314b, respectively, the third sidewall 305 and the fourth sidewall 307 are protected and remain intact (or substantially protected and intact) during the etching process of 206a and are not removed, as the first sidewall 301 and the second sidewall 303 are. Accordingly, the length defined by the first sidewall 301 and the second sidewall 303 along the y-axis defined through the features 306 is increased by a predetermined distance and the width defined by the third sidewall 305 and the fourth sidewall 307 along the x-axis defined through the features 306 is maintained (compare T1 and T2 of FIG. 3A with T1 and T2 of FIG. 3F).

The etching process at 206a can be performed using, for example, the etching apparatus 30, which as noted above, can be configured to perform a dry etching process, or other suitable etching process on the substrate 300. The etch process can be an anisotropic, or directional etch in a substantially orthogonal direction to the substrate 300, or isotropic, or uniformly etched in all directions to the substrate 300. That is, the top portion(s) 310 of the features 306 that are covered by the material 320 that forms the overhangs 314a, 314b are not etched during the etching process, which ensures that the third sidewall 305 and the fourth sidewall 307 are not removed during the etching process at 206a. Conversely, portions (e.g., a slice of the first sidewall 301 and the second sidewall 303 that extends from the top portion 310 to the bottom portion 312) of the first sidewall 301 and the second sidewall 303, which have less deposited material 320 and are not protected by overhangs, are removed. The etching process at 206a can be repeated one or more times until a desired length between the first sidewall 301 and the second sidewall 303 is obtained.

Next, at 208 a removal/strip process can be performed to the remove/strip the material 320 away from the substrate 300, e.g., from the top portion 310, using the target material removal apparatus 40, as shown in FIG. 3F.

Figure 4A:
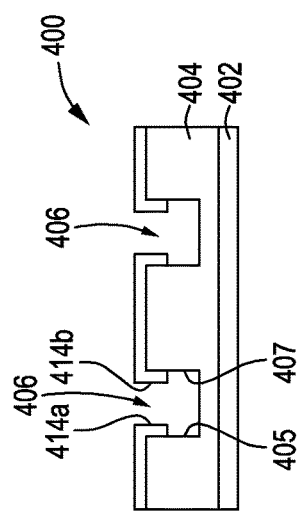
FIGS. 4A-4C illustrate schematic diagrams of stages of fabrication of a substrate undergoing methods in accordance with at least some embodiments of the disclosure.
Figure 4A:
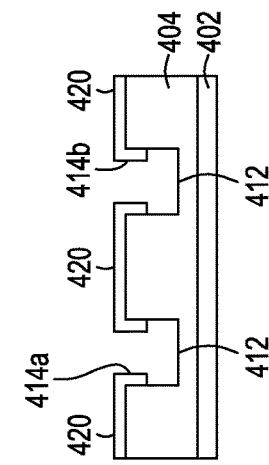
Figure 4A:
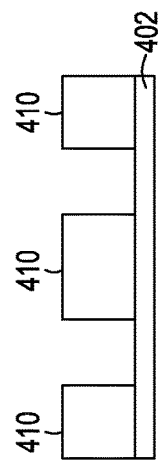
Figure 4A:
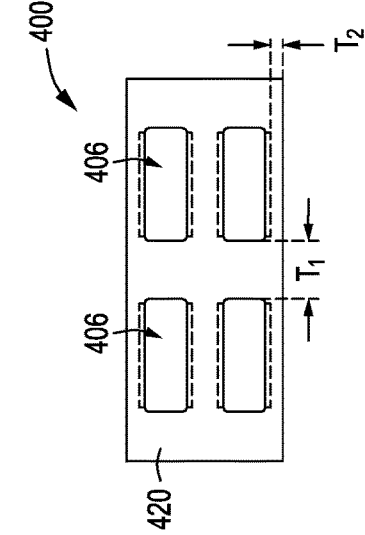
Figure 4B:
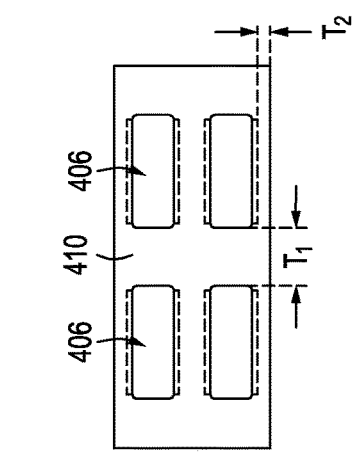
Figure 4C:
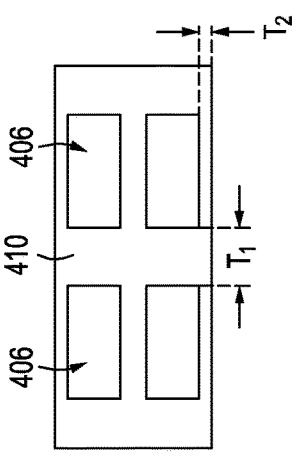

FIGS. 4A-4C illustrate schematic diagrams of stages of fabrication of a substrate undergoing methods in accordance with at least some embodiments of the disclosure. The method 200 described above can be used to form a substrate 400 of FIGS. 4A-4C. The substrate 400 can be identical to the substrate 300 and can include at least one feature 406, a layer 402, and a layer 404. Accordingly, only the parts of the method 200 that are unique to the substrate 400 are described herein.

More particularly, as opposed to etching directly through the material 420 deposited on the top portion 410 adjacent the first sidewall 401 and the second sidewall 403 to remove the portions of the first sidewall 401 and the second sidewall 403 as described above, the etching process can be performed in stages (e.g., performed sequentially). For example, at 206b some of the material 420 deposited on the top portion 410 adjacent to the first sidewall 401 and the second sidewall 403 can first be selectively etched to expose portions 410a of the top portion 410 (see FIGS. 4A and 4B, for example) adjacent the first sidewall 401 and the second sidewall 403, using, for example, one or more of the above-described etching processes (e.g., de-scum etch, anisotropic, isotropic, etc.). The amount of or number of times that the material 420 that is selectively etched at 206b can depend on, for example, what the material 420 is made of, a thickness of the material 420 that is deposited on the top portion 410, the type of etch process used at 206b, the material used for the layer 402, etc.

Next, at 206c the exposed portions 410a can be selectively etched to remove the first sidewall 401 and the second sidewall 403 as described above, while keeping the third sidewall 405 and the fourth sidewall 407 intact, e.g., because of the amount of material 420 deposited adjacent the third sidewall 405 and the fourth sidewall 407 and used to form the overhangs 414a, 414b, thus protecting the third sidewall 405 and the fourth sidewall 407 during the etch process of 206c.

In some embodiments, after the etching processes of 206a and/or 206c, the method 200 can include removing the bottom portions 312, 412 of the layers 304, 404, respectively. For illustrative purposes, the bottom portion 412 of the layer 404 is shown removed. For example, after etching at 206c to remove the portions of the first sidewall 401 and the second sidewall 403 is completed and prior to striping or removing the material 420 at 208, the etching process used at 206c (or a different etching process) can be used to selectively remove the bottom portion 412, which as noted above can be a sacrificial layer.

While the foregoing is directed to embodiments of the present disclosure, other and further embodiments of the disclosure may be devised without departing from the basic scope thereof.

What is claimed is:

1. A method for processing a substrate, comprising:
directing a stream of material from a PVD source toward a surface of a substrate at a first non-perpendicular angle to a plane of the surface to selectively deposit a material on a top portion of one or more features on the substrate and form a first overhang and a second overhang extending beyond a third sidewall and a fourth sidewall that are arranged parallel and opposite to each other and at non-zero angles to a first sidewall and a second sidewall, the first sidewall and the second sidewall defining a length along a y-axis defined through the one or more features, and the third sidewall and fourth sidewall defining a width along an x-axis defined through the one or more features; and
performing an etch process to selectively remove some of the first sidewall and the second sidewall to increase the length of the one or more features by a predetermined distance while keeping the third sidewall and fourth sidewall in intact and maintaining the width of the one or more features.

2. The method of claim 1, further comprising, prior to performing the etch process to remove some of the first sidewall and the second sidewall, performing a de-scum etch process to remove deposited material on the first sidewall and the second sidewall.

3. The method of claim 2, wherein the etch process to remove some of the first sidewall and the second sidewall and the de-scum etch process to remove deposited material on the first sidewall and the second sidewall is an anisotropic etch process.

4. The method of claim 1, wherein the etch process to remove some of the first sidewall and the second sidewall comprises sequentially removing some of the deposited material on the top portion of the one more or more features adjacent the first sidewall and the second sidewall.

5. The method of claim 1, further comprising, after performing the etch process to remove some of the first sidewall and the second sidewall, performing a strip process to remove the deposited material from the one or more features.

6. The method of claim 5, further comprising, after performing the strip process, performing another etch process to remove a bottom portion of the one or more features and expose an etch stop layer of the substrate.

7. The method of claim 1, wherein the etch process to remove some of the first sidewall and the second sidewall comprises removing some of the first overhang and the second overhang extending beyond the third sidewall and the fourth sidewall.

8. A method for processing a substrate, comprising:
directing a stream of material from a PVD source toward a surface of a substrate at a first non-perpendicular angle to a plane of the surface to selectively deposit a material on a top portion of one or more features on the substrate and form a first overhang and a second overhang extending beyond a third sidewall and a fourth sidewall that are arranged parallel and opposite to each other and at non-zero angles to a first sidewall and a second sidewall, the first sidewall and the second sidewall defining a length along a y-axis defined through the one or more features, and the third sidewall and fourth sidewall defining a width along an x-axis defined through the one or more features; and performing an etch process to sequentially remove some of the deposited material on the top portion of the one more or more features adjacent the first sidewall and the second sidewall to increase the length of the one or more features by a predetermined distance while keeping the third sidewall and fourth sidewall in intact and maintaining the width of the one or more features.

9. The method of claim 8, further comprising, prior to performing the etch process to remove some of the first sidewall and the second sidewall, performing a de-scum etch process to remove deposited material on the first sidewall and the second sidewall.

10. The method of claim 9, wherein the etch process to remove some of the first sidewall and the second sidewall and the de-scum etch process to remove deposited material on the first sidewall and the second sidewall is an anisotropic etch process.

11. The method of claim 8, further comprising, after performing the etch process to remove some of the first sidewall and the second sidewall, performing a strip process to remove the deposited material from the one or more features.

12. The method of claim 11, further comprising, after performing the strip process, performing another etch process to remove a bottom portion of the one or more features and expose an etch stop layer of the substrate.

13. The method of claim 8, wherein the etch process to remove some of the first sidewall and the second sidewall comprises removing some of the first overhang and the second overhang extending beyond the third sidewall and the fourth sidewall.

14. A nontransitory computer readable storage medium having stored thereon a plurality of instructions that when executed cause a process controller to perform a method for processing a substrate, the method comprising:

directing a stream of material from a PVD source toward a surface of a substrate at a first non-perpendicular angle to a plane of the surface to selectively deposit a material on a top portion of one or more features on the substrate and form a first overhang and a second overhang extending beyond a third sidewall and a fourth sidewall that are arranged parallel and opposite to each other and at non-zero angles to a first sidewall and a second sidewall, the first sidewall and the second sidewall defining a length along a y-axis defined through the one or more features, and the third sidewall and fourth sidewall defining a width along an x-axis defined through the one or more features; and performing an etch process to selectively remove some of the first sidewall and the second sidewall to increase the length of the one or more features by a predetermined distance while keeping the third sidewall and fourth sidewall in intact and maintaining the width of the one or more features.

15. The nontransitory computer readable storage medium of claim 14, further comprising, prior to performing the etch process to remove some of the first sidewall and the second sidewall, performing a de-scum etch process to remove deposited material on the first sidewall and the second sidewall.

16. The nontransitory computer readable storage medium of claim 15, wherein the etch process to remove some of the first sidewall and the second sidewall and the de-scum etch process to remove deposited material on the first sidewall and the second sidewall is an anisotropic etch process.

17. The nontransitory computer readable storage medium of claim 14, wherein the etch process to remove some of the first sidewall and the second sidewall comprises sequentially removing some of the deposited material on the top portion of the one more or more features adjacent the first sidewall and the second sidewall.

18. The nontransitory computer readable storage medium of claim 14, further comprising, after performing the etch process to remove some of the first sidewall and the second sidewall, performing a strip process to remove the deposited material from the one or more features.

19. The nontransitory computer readable storage medium of claim 18, further comprising, after performing the strip process, performing another etch process to remove a bottom portion of the one or more features and expose an etch stop layer of the substrate.

20. The nontransitory computer readable storage medium of claim 14, wherein the etch process to remove some of the first sidewall and the second sidewall comprises removing some of the first overhang and the second overhang extending beyond the third sidewall and the fourth sidewall.

* * * * *